US009958790B2

(12) United States Patent
Nooitgedagt et al.

(10) Patent No.: US 9,958,790 B2
(45) Date of Patent: May 1, 2018

(54) INSPECTION METHODS, SUBSTRATES HAVING METROLOGY TARGETS, LITHOGRAPHIC SYSTEM AND DEVICE MANUFACTURING METHOD

(71) Applicant: ASML Netherlands B.V., Veldhoven (NL)

(72) Inventors: Tjitte Nooitgedagt, Veldhoven (NL); Marc Jurian Kea, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days. days.

(21) Appl. No.: 15/105,349

(22) PCT Filed: Nov. 20, 2014

(86) PCT No.: PCT/EP2014/075165
§ 371 (c)(1),
(2) Date: Jun. 16, 2016

(87) PCT Pub. No.: WO2015/090838
PCT Pub. Date: Jun. 25, 2015

(65) Prior Publication Data
US 2016/0327871 A1 Nov. 10, 2016

(30) Foreign Application Priority Data

Dec. 19, 2013 (EP) .................................. 13198362

(51) Int. Cl.
*G03F 7/20* (2006.01)
(52) U.S. Cl.
CPC ...... *G03F 7/70625* (2013.01); *G03F 7/70466* (2013.01); *G03F 7/70633* (2013.01); *G03F 7/70683* (2013.01)

(58) Field of Classification Search
CPC ............ G03F 7/70466; G03F 7/70625; G03F 7/70633; G03F 7/70683
See application file for complete search history.

(56) References Cited

U.S. PATENT DOCUMENTS

2003/0186141 A1  10/2003  Park et al.
2005/0012928 A1*  1/2005  Sezginer ............... G01B 11/26
                                                              356/401
(Continued)

FOREIGN PATENT DOCUMENTS

EP           2602663 A1   6/2013
WO   WO 2009/078708 A1   6/2009
(Continued)

OTHER PUBLICATIONS

International Preliminary Report on Patentability directed to related European Application No. PCT/EP2014/075165, dated Jun. 21, 2016; 5 pages.

(Continued)

*Primary Examiner* — Steven H Whitesell Gordon
(74) *Attorney, Agent, or Firm* — Sterne, Kessler, Goldstein & Fox P.L.L.C.

(57) ABSTRACT

Disclosed is a method of measuring overlay between upper and lower layers on a substrate using metrology targets formed by a lithographic process. The lithographic process is of a multiple-patterning type whereby first and second distinct populations of structures are formed in a single one of said layers (L1) by respective first and second patterning steps. The metrology target (620) in the single one of said layers comprises a set of structures of which different subsets (642A, 642B) are formed in said first and second patterning steps. An overlay measurement on this target can (Continued)

be used to calculate a combined (average) overlay performance parameter for both of the first and second patterning steps.

13 Claims, 7 Drawing Sheets

(56) References Cited

U.S. PATENT DOCUMENTS

| | | |
|---|---|---|
| 2006/0033921 A1 | 2/2006 | Den Boef et al. |
| 2009/0246709 A1 | 10/2009 | Nakasugi et al. |
| 2009/0262362 A1* | 10/2009 | de Groot ............ G03F 7/70633 356/508 |
| 2010/0201963 A1 | 8/2010 | Cramer et al. |
| 2011/0003256 A1* | 1/2011 | Van Der Heijden ............ G03F 7/70466 430/324 |
| 2011/0027704 A1 | 2/2011 | Cramer et al. |
| 2011/0043791 A1 | 2/2011 | Smilde et al. |
| 2012/0044470 A1* | 2/2012 | Smilde ............... G03F 1/44 355/53 |
| 2012/0123581 A1 | 5/2012 | Smilde et al. |
| 2012/0162647 A1* | 6/2012 | Li ............... G03F 7/70633 356/399 |
| 2013/0100427 A1 | 4/2013 | Koolen et al. |
| 2013/0258310 A1 | 10/2013 | Smilde et al. |
| 2013/0271740 A1 | 10/2013 | Quintanilha |

FOREIGN PATENT DOCUMENTS

| | | |
|---|---|---|
| WO | WO 2009/106279 A1 | 9/2009 |
| WO | WO 2013/178422 A1 | 12/2013 |
| WO | WO 2014/146906 A2 | 9/2014 |

OTHER PUBLICATIONS

International Search Report and Written Opinion of the International Search Authority directed to related International Patent Application No. PCT/EP2014/075165, dated Mar. 16, 2015; 7 pages.

Lee et al. "Diffraction-Based Overlay for Spacer Patterning and Double Patterning Technology," Metrology, Inspection, and Process Control for Microlithography, SPIE, vol. 7971, 2011; 10 pages.

"Multiple Patterning," Wikipedia.org, 2013; 8 pages.

* cited by examiner

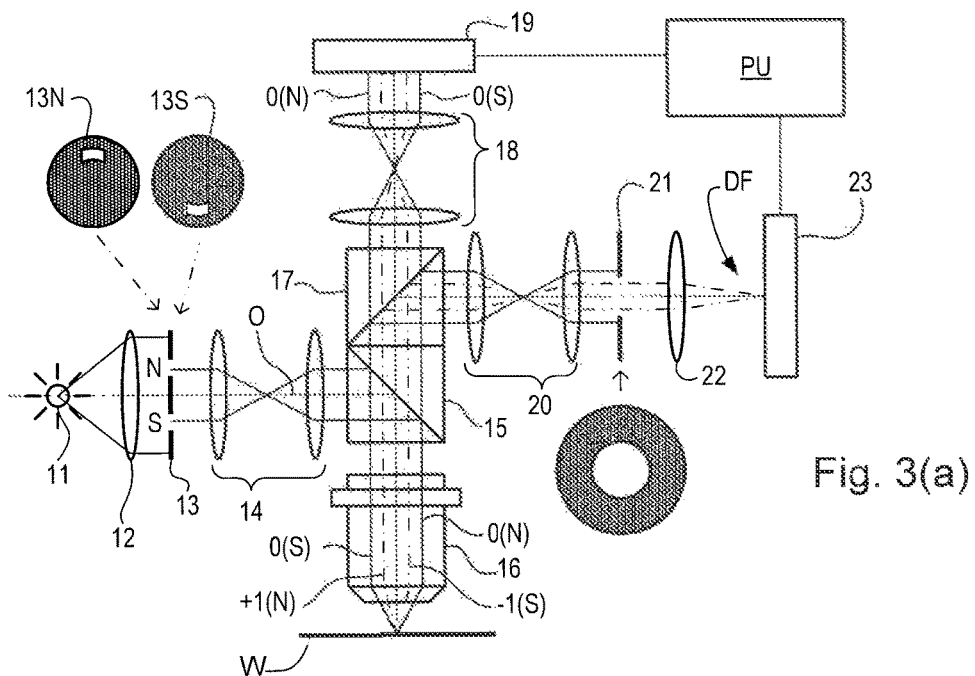
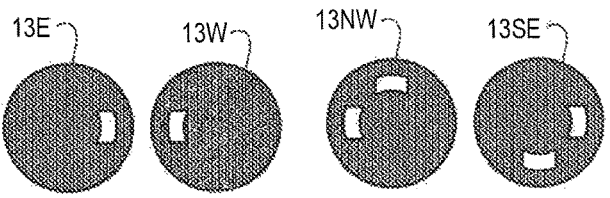
Fig. 3(a)
Fig. 3 (b)    Fig. 3(c)    Fig. 3 (d)
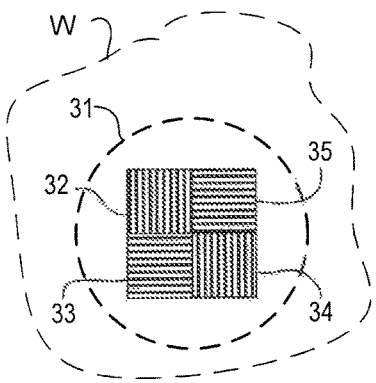
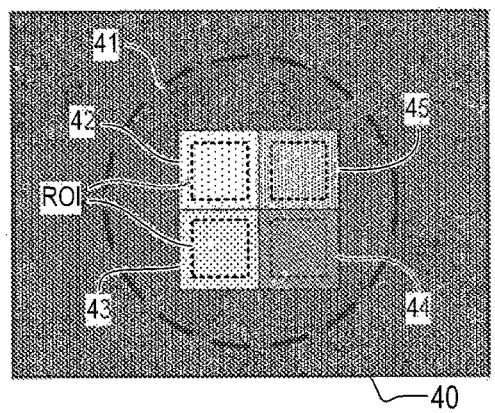
Fig. 4 (PRIOR ART)    Fig. 5 (PRIOR ART)

INSPECTION METHODS, SUBSTRATES HAVING METROLOGY TARGETS, LITHOGRAPHIC SYSTEM AND DEVICE MANUFACTURING METHOD

CROSS-REFERENCE TO RELATED APPLICATIONS

This application claims the benefit of EP application 13198362, which was filed on Dec. 19, 2013 and which is incorporated herein in its entirety by reference.

BACKGROUND

Field of the Invention

The present invention relates to methods and apparatus for metrology usable, for example, in the manufacture of devices by lithographic techniques and to methods of manufacturing devices using lithographic techniques.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field. These devices direct a beam of radiation onto a target and measure one or more properties of the scattered radiation e.g., intensity at a single angle of reflection as a function of wavelength; intensity at one or more wavelengths as a function of reflected angle; or polarization as a function of reflected angle to obtain a "spectrum" from which a property of interest of the target can be determined. Determination of the property of interest may be performed by various techniques: e.g., reconstruction of the target structure by iterative approaches such as rigorous coupled wave analysis or finite element methods; library searches; and principal component analysis.

Examples of known scatterometers include angle-resolved scatterometers of the type described in US2006033921A1 and US2010201963A1. The targets used by such scatterometers are relatively large, e.g., 40 µm by 40 µm, gratings and the measurement beam generates a spot that is smaller than the grating (i.e., the grating is underfilled). This simplifies mathematical reconstruction of the target as it can be regarded as infinite. In order to reduce the size of the targets, e.g., to 10 µm by 10 µm or less, e.g., so they can be positioned in amongst product features, rather than in the scribe lane, metrology has been proposed in which the grating is made smaller than the measurement spot (i.e., the grating is overfilled). Typically such targets are measured using "dark field" scatterometry in which the zeroth order of diffraction (corresponding to a specular reflection) is blocked, and only higher orders processed. Diffraction-based overlay using this dark field technique enables overlay measurements on smaller targets. Examples of dark field metrology can be found in international patent applications WO 2009/078708 and WO 2009/106279 which documents are hereby incorporated by reference in their entirety. Further developments of the technique have been described in published patent publications US20110027704A, US20110043791A, US20120044470A US20120123581A, US20130258310A and US20130271740A; and in the U.S. patent applications 61/652,552 and 61/803,673. These targets can be smaller than the illumination spot and may be surrounded by product structures on a wafer. Multiple gratings can be measured in one image, using a composite grating target. The contents of all these applications are also incorporated herein by reference.

In the known metrology technique, overlay measurement results are obtained by measuring the target twice under certain conditions, while either rotating the target or changing the illumination mode or imaging mode to obtain separately the $-1^{st}$ and the $+1^{st}$ diffraction order intensities. Comparing these intensities for a given grating provides a measurement of asymmetry in the grating, and asymmetry in an overlay grating can be used as an indicator of overlay error.

A problem arises when overlay is to be measured, and one of the layers contains different populations of features, formed by different steps in a process. For example, the finest product features are nowadays formed by multiple-patterning steps. An example is litho-etch-litho-etch (LELE) double patterning, but the invention can be applied with other multiple-patterning techniques. Applying the known techniques and target designs requires that overlay is measured separately for each population, that is to say once for each patterning step. An average overlay can then be calculated and used for subsequent control/process improvement. However, the separate measurements imply a doubling of the substrate area occupied by overlay metrology targets, and a doubling in the measurement time required also.

SUMMARY OF THE INVENTION

It is desirable to provide a technique for metrology to measure overlay or other parameters in multiple-patterned layers, which does not incur additional overhead in target area and/or in measurement time, while using if possible the existing metrology hardware.

The invention in a first aspect provides a method of measuring a performance parameter of a lithographic process, the method comprising the steps of:
(a) performing said lithographic process to form at least one metrology target having overlying structures formed in upper and lower layers on a substrate;
(b) using an inspection apparatus to take one or more measurements of asymmetry in said metrology target; and
(c) calculating using the results of said asymmetry measurements a measurement of the performance parameter of the lithographic process, wherein the lithographic process is of a multiple-patterning type whereby first and second distinct populations of structures are formed in a single one of said layers by respective first and second patterning steps, and wherein for each of the measurements in step (b) said metrology target comprises a set of structures of which different subsets are formed in said first and second patterning steps.

The inventors have recognized that it is possible and useful to measure directly the average of a performance parameter for the two populations, using a single target that combines features from the two processing steps of the double patterning process in a single asymmetry measurement.

In one embodiment, said performance parameter is overlay between the upper and lower layers, and is calculated by measurements of asymmetry in at least two metrology targets which have different known components of positional offset (bias) between the upper and lower layers.

In one embodiment, the structures formed in said first and second patterning steps are in the lower layer. In principle, the multiple patterned structures could be in the upper layer.

The method may further comprise a step of (d) using the calculated combined performance parameter to apply positioning corrections when the lithographic process is applied to further substrates. Where the performance parameter is overlay, for example, the combined overlay measurement is used to position product features in an upper one of the layers accurately over features in a lower one of the layers.

The method can be implemented using existing metrology apparatus such as a scatterometer. The method can be implemented in an automated apparatus using suitable control software.

In a second aspect, the invention provides a substrate provided with at least one metrology target having overlying structures formed in upper and lower layers on said substrate, wherein the metrology target in at least one of said layers comprises structures formed in two patterning steps of a multiple-patterning process.

In one embodiment, the metrology target is a composite target comprising a plurality of overlay gratings, wherein each overlay grating is formed with a positional offset between the layers that is a combination of both known and unknown components, the known components being different for different component gratings.

The invention in the second aspect further provides a set of patterning devices for use in a lithographic process, the patterning devices defining patterns that when applied to a substrate will produce a substrate having one or more metrology targets according to the second aspect of the invention, as set forth above.

The method can be implemented using existing metrology apparatus such as a scatterometer.

The method step (d) can be implemented in an automated lithographic process control system using modified software.

The invention yet further provides a lithographic system comprising:
  one or more lithographic apparatuses arranged to transfer a sequence of patterns from patterning devices onto a substrate in an overlying manner so as to produce one or more metrology targets on a substrate in accordance with step (a) of a method according to the invention as set forth above;
  an inspection apparatus arranged to perform the step (b) of the method on one or more of said metrology targets;
  a processor arranged to perform the step (c) of the method to calculate a combined performance parameter for said metrology targets; and
  a controller for using the calculated performance parameter to control a lithographic apparatus in applying at least one of said patterns to further substrates.

The invention yet further provides a method of manufacturing devices wherein a sequence of device patterns is applied to a series of substrates using a lithographic process, the method including inspecting a plurality of metrology targets as part of or beside said device patterns on at least one of said substrates using steps (a) to (c) of an inspection method as set forth above, and controlling the lithographic process for later substrates in accordance with the calculated performance parameter.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying drawings in which:

FIGS. 3(a)-3(d) comprise (a) a schematic diagram of a dark field scatterometer for use in measuring targets according to embodiments of the invention using a first pair of illumination apertures, (b) a detail of diffraction spectrum of a target grating for a given direction of illumination (c) a second pair of illumination apertures providing further illumination modes in using the scatterometer for diffraction based overlay measurements and (d) a third pair of illumination apertures combining the first and second pair of apertures;

FIG. 4 depicts a known form of multiple grating metrology target and an outline of a measurement spot on a substrate;

FIG. 5 depicts an image of the target of FIG. 4 obtained in the scatterometer of FIG. 3;

FIG. 9 shows steps in the production of a novel metrology target using a double patterning process at (a), (b), (d) and (f) in schematic cross-section and at (c), (e) and (g) in plan view;

DETAILED DESCRIPTION OF EXEMPLARY EMBODIMENTS

Before describing embodiments of the invention in detail, it is instructive to present an example environment in which embodiments of the present invention may be implemented.

Figure 1:
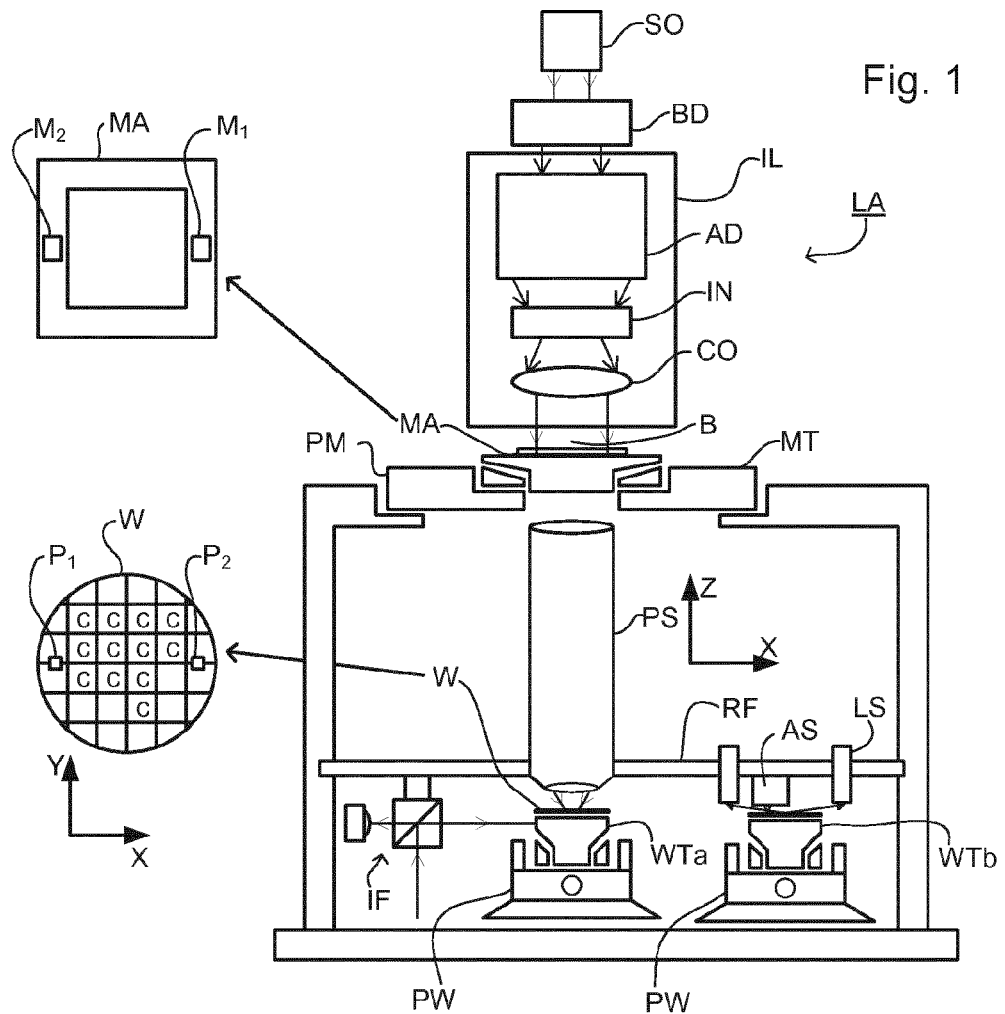
FIG. 1 depicts a lithographic apparatus according to an embodiment of the invention.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan. In general, movement of the patterning device support (e.g., mask table) MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the patterning device support (e.g., mask table) MT may be connected to a short-stroke actuator only, or may be fixed.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features.

The depicted apparatus could be used in a variety of modes. In a scan mode, the patterning device support (e.g., mask table) MT and the substrate table WT are scanned synchronously while a pattern imparted to the radiation beam is projected onto a target portion C (i.e., a single dynamic exposure). The velocity and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WT is moved or scanned.

Combinations and/or variations on the above described modes of use or entirely different modes of use may also be employed.

Lithographic apparatus LA is of a so-called dual stage type which has two substrate tables WTa, WTb and two stations—an exposure station and a measurement station—between which the substrate tables can be exchanged. While one substrate on one substrate table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS.

Figure 2:
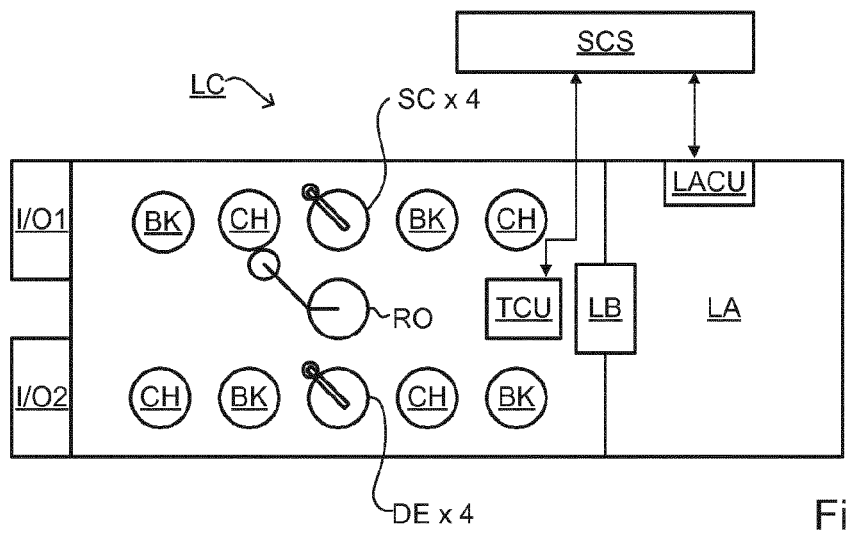
FIG. 2 depicts a lithographic cell or cluster according to an embodiment of the Invention.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

A metrology apparatus (scatterometer) suitable for use in embodiments of the invention is shown in FIG. 3(a). A grating target T and diffracted rays are illustrated in more detail in FIG. 3(b). More detail of the apparatus and variations in its forma and usage are provided in US 2011027704 and other prior patent applications, mentioned above. The entire contents of those prior applications are incorporated herein by reference. The scatterometer may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The aperture plates in the present examples form various off-axis illumination modes. In the first illumination mode, aperture plate 13N provides off-axis illumination from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

As shown in FIG. 3(b), grating target T is placed with substrate W normal to the optical axis O of objective lens 16. A ray of illumination I impinging on target T from an angle off the axis O gives rise to a zeroth order ray (solid line O) and two first order rays (dot-chain line +1 and double dot-chain line −1). It should be remembered that with an overfilled small target grating, these rays are just one of many parallel rays covering the area of the substrate including metrology target T and other features. Where a composite grating target is provided, each individual grating within the target will give rise to its own diffraction spectrum. Since the aperture in plate 13 has a finite width (necessary to admit a useful quantity of light), the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches and illumination angles can be designed or adjusted so that the first order rays entering the objective lens are closely aligned with the central optical axis. The rays illustrated in FIGS. 3(a) and 3(b) are shown somewhat off axis, purely to enable them to be more easily distinguished in the diagram.

At least the 0 and +1 orders diffracted by the target on substrate W are collected by objective lens 16 and directed back through beam splitter 15. Returning to FIG. 3(*a*), both the first and second illumination modes are illustrated, by designating diametrically opposite apertures labeled as north (N) and south (S). When the incident ray I is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for asymmetry measurement as well as for many measurement purposes such as reconstruction, which are not the subject of the present disclosure. The first examples to be described will use the second measurement branch to measure asymmetry.

In the second measurement branch, optical system 20, 22 forms an image of the target on the substrate W on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to image processor and controller PU, the function of which will depend on the particular type of measurements being performed. Note that the term 'image' is used here in a broad sense. An image of the grating lines as such will not be formed on sensor 23, if only one of the −1 and +1 orders is present.

The particular forms of aperture plate 13 and field stop 21 shown in FIG. 3 are purely examples. In another embodiment of the invention, on-axis illumination of the targets is used, and an aperture stop with an off-axis aperture is used to pass substantially only one first order of diffracted light to the sensor. (The apertures shown at 13 and 21 are effectively swapped in that case.) In yet other embodiments, 2nd, 3rd and higher order beams (not shown in FIG. 3) can be used in measurements, instead of or in addition to the first order beams.

In order to make the illumination adaptable to these different types of measurement, the aperture plate 13 may comprise a number of aperture patterns formed around a disc, which rotates to bring a desired pattern into place. Alternatively or in addition, a set of plates 13 could be provided and swapped, to achieve the same effect. A programmable illumination device such as a deformable mirror array or transmissive spatial light modulator can be used also. Moving mirrors or prisms can be used as another way to adjust the illumination mode.

As just explained in relation to aperture plate 13, the selection of diffraction orders for imaging can alternatively be achieved by altering the pupil-stop 21, or by substituting a pupil-stop having a different pattern, or by replacing the fixed field stop with a programmable spatial light modulator. In that case the illumination side of the measurement optical system can remain constant, while it is the imaging side that has first and second modes. In practice, there are many possible types of measurement method, each with its own advantages and disadvantages. In one method, the illumination mode is changed to measure the different orders. In another method, the imaging mode is changed. In a third method, the illumination and imaging modes remain unchanged, but the target is rotated through 180 degrees. In each case the desired effect is the same, namely to select first and second portions of the non-zero order diffracted radiation which are symmetrically opposite one another in the diffraction spectrum of the target.

While the optical system used for imaging in the present examples has a wide entrance pupil which is restricted by the field stop 21, in other embodiments or applications the entrance pupil size of the imaging system itself may be small enough to restrict to the desired order, and thus serve also as the field stop. Different aperture plates are shown in FIGS. 3(*c*) and (*d*) which can be used as described further below.

Typically, a target grating will be aligned with its grating lines running either north-south or east-west. That is to say, a grating will be aligned in the X direction or the Y direction of the substrate W. Note that aperture plate 13N or 13S can only be used to measure gratings oriented in one direction (X or Y depending on the set-up). For measurement of an orthogonal grating, rotation of the target through 90° and 270° might be implemented. More conveniently, however, illumination from east or west is provided in the illumination optics, using the aperture plate 13E or 13W, shown in FIG. 3(*c*). The aperture plates 13N to 13W can be separately formed and interchanged, or they may be a single aperture plate which can be rotated by 90, 180 or 270 degrees. As mentioned already, the off-axis apertures illustrated in FIG. 3(*c*) could be provided in field stop 21 instead of in illumination aperture plate 13. In that case, the illumination would be on axis.

FIG. 3(*d*) shows a third pair of aperture plates that can be used to combine the illumination modes of the first and second pairs. Aperture plate 13NW has apertures at north and east, while aperture plate 13SE has apertures at south and west. Provided that cross-talk between these different diffraction signals is not too great, measurements of both X and Y gratings can be performed without changing the illumination mode. A further variety of aperture plate 13Q will be illustrated in the example of FIGS. 12 and 13.

Overlay Measurement Using Small Targets—Introduction

FIG. 4 depicts a composite grating target formed on a substrate W according to known practice. The composite target comprises four individual gratings 32 to 35 positioned closely together so that they will all be within a measurement spot 31 formed by the illumination beam of the metrology apparatus. The four targets thus are all simultaneously illuminated and simultaneously imaged on sensors 19 and 23. In an example dedicated to overlay measurement, gratings 32 to 35 are themselves composite gratings formed by overlying gratings that are patterned in different layers of the semi-conductor device formed on substrate W. Gratings 32 to 35 may have differently biased overlay offsets in order to facilitate measurement of overlay between the layers in which the different parts of the composite gratings are formed. Gratings 32 to 35 may also differ in their orientation, as shown, so as to diffract incoming radiation in X and Y directions. In one example, gratings 32 and 34 are X-direction gratings with biases of +d, −d, respectively. This means that grating 32 has its overlying components arranged so that if they were both printed exactly at their nominal locations one of the components would be offset relative to the other by a distance d. Grating 34 has its components arranged so that, if perfectly printed, there would be an offset of d but in the opposite direction to the first grating and so on. Gratings 33 and 35 are Y-direction gratings with offsets +d and −d respectively. While four gratings are illustrated, another embodiment might require a larger matrix to obtain the desired accuracy. For example, a 3×3 array of nine composite gratings may have biases −4d, −3d, −2d, −d, 0, +d, +2d, +3d, +4d. Separate images of these gratings can be identified in the image captured by sensor 23.

FIG. 5 shows an example of an image that may be formed on and detected by the sensor 23, using the target of FIG. 4 in the apparatus of FIG. 3, using the aperture plates 13NW or 13SE from FIG. 3(*d*). While the pupil plane image sensor 19 cannot resolve the different individual gratings 32 to 35, the image sensor 23 can do so. The cross-hatched rectangle 40 represents the field of the image on the sensor, within which the illuminated spot 31 on the substrate is imaged into a corresponding circular area 41. Ideally the field is dark. Within this dark field image, rectangular areas 42-45 represent the images of the individual gratings 32 to 35. If the gratings are located in product areas, product features may also be visible in the periphery of this image field. While only a single composite grating target is shown in the dark field image of FIG. 5, in practice a semiconductor device or other product made by lithography may have many layers, and overlay measurements are desired to be made between different pairs of layers. For each overlay measurement between pair of layers, one or more composite grating targets are required, and therefore other composite grating targets may be present, within the image field. Image processor and controller PU processes these images using pattern recognition to identify the separate images 42 to 45 of gratings 32 to 35.

Once the separate images of the gratings have been identified, the intensities of those individual images can be measured, e.g., by averaging or summing selected pixel intensity values within the identified areas. Intensities and/or other properties of the images can be compared with one another. These results can be combined to measure different parameters of the lithographic process. Overlay performance is an important example of such a parameter, and comparing the intensities reveals asymmetries that can be used as a measure of overlay. In another technique for measuring asymmetry and hence overlay, the pupil plane image sensor 19 is used.

Figure 6:
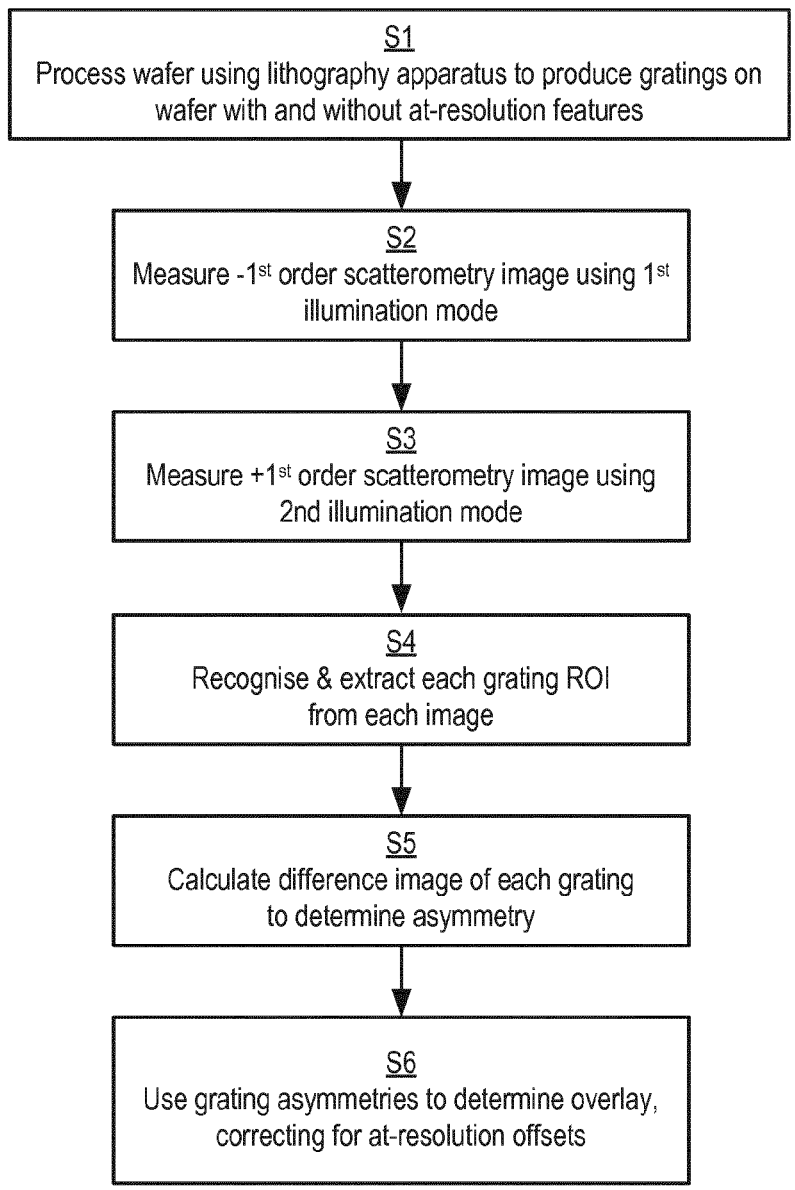
FIG. 6 is a flowchart showing the steps of a known overlay measurement method using the scatterometer of FIG. 3 and metrology target of FIG. 4, which can be adapted to implement embodiments of the present invention.
Figure 7A:
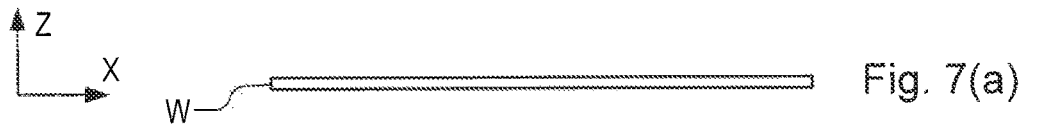
FIGS. 7(a)-7(e) show steps in the production of a pair of conventional metrology targets using a double patterning process at (a) to (d) in schematic cross-section and at (e) in plan view.
Figure 7B:
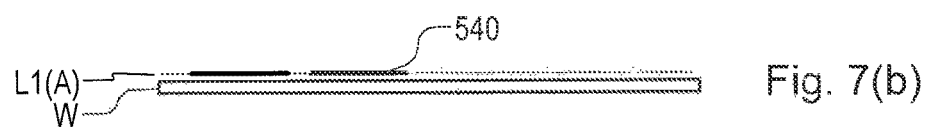
Figure 7C:
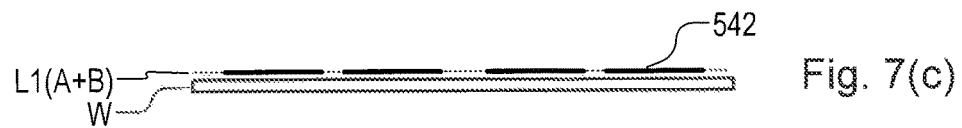
Figure 7D:
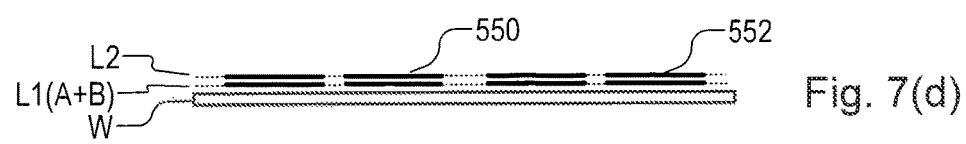
Figure 7E:
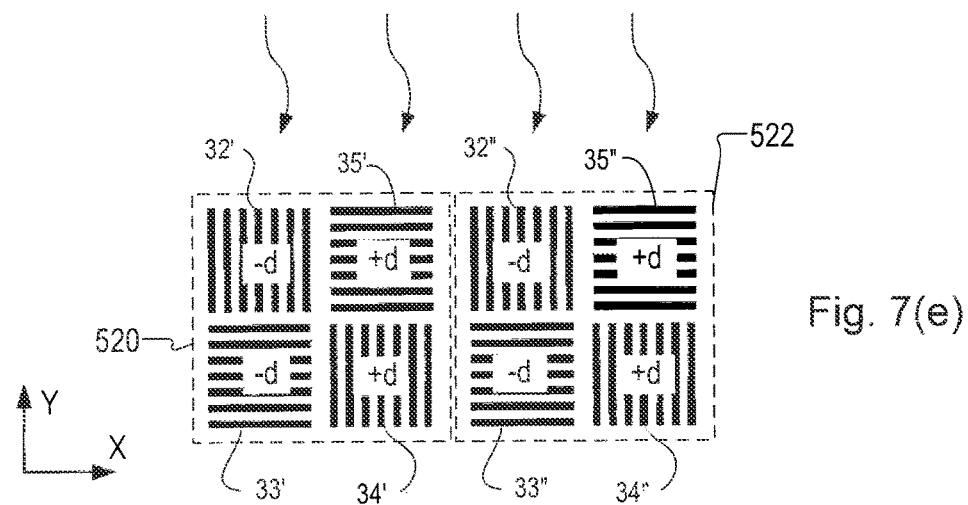

FIG. 6 illustrates a basic method of measuring overlay using the apparatus and targets described above. The invention is not limited to dark field techniques, nor even to angle-resolved scatterometry. The method in this example is based on the method described in application US 2011027704 using the apparatus of FIGS. 3 and 4. In principle, overlay error between the two layers containing the component gratings 32 to 35 is measured through asymmetry of the gratings, as revealed by comparing their intensities in the +1 order and −1 order dark field images. At step S1, the substrate, for example a semiconductor wafer, is processed through the lithographic cell of FIG. 2 one or more times, to create a structure including overlay gratings 32-35 that form a metrology target.

At S2, using the metrology apparatus of FIG. 3, an image of the gratings 32 to 35 is obtained using only one of the first order diffracted beams (say −1). Then, whether by changing the illumination mode, or changing the imaging mode, or by rotating substrate W by 180° in the field of view of the metrology apparatus, a second image of the gratings using the other first order diffracted beam (+1) can be obtained (step S3). Consequently the +1 diffracted radiation is captured in the second image. It is a matter of design choice whether all the gratings 32-35 can be captured in each image, or whether the scatterometer and substrate need to be moved so as to capture the gratings in separate images. In either case, it is assumed that first and second images of all the component gratings are captured via image sensor 23.

Note that, by including only half of the first order diffracted radiation in each image, the 'images' referred to here are not conventional dark field microscopy images. Each grating will be represented simply by an area of a certain intensity level. The individual grating lines will not be resolved, because only one of the +1 and −1 order diffracted radiation is present. In step S4, a region of interest (ROI, see FIG. 4) is carefully identified within the image of each component grating, from which intensity levels will be measured. This is done because, particularly around the edges of the individual grating images, intensity values can be highly dependent on process variables such as resist thickness, composition, line shape, as well as edge effects generally.

Having identified the ROI for each individual grating and measured its intensity, the asymmetry of the grating structure, and hence overlay error, can then be determined. As described in the prior applications, this is done by the image processor and controller PU in step S5 comparing the intensity values obtained for +1 and −1 orders for each grating 32-35 to identify any difference in their intensity. The intensity difference is calculated at step S5 to obtain a measurement of asymmetry for each grating. At step S6, from the asymmetry measurements and from knowledge of the overlay biases of the gratings, a processor calculates overlay error in the vicinity of the target T.

In the prior applications, mentioned above, various techniques are disclosed for improving the quality of overlay measurements using the basic method mentioned above. These techniques are explained in the prior applications, and will not be explained here in further detail. They may be used in combination with the techniques newly disclosed in the present application, which will now be described.

Measurement of Overlay in Multiple-Patterned Targets

It will now be illustrated how the techniques described above can be applied to use the known scatterometer to measure layer-to-layer overlay in a device being manufactured by a so called double-patterning processes (generally multiple-patterning). Techniques in this category include pitch-doubling, for example by litho-etch-litho-etch (LELE) and self-aligned dual-damascene in back end-of the line (BEOL) layers. In the multiple-patterning process, structures are formed in one layer of the product not in one patterning operation but in two or more patterning steps. Thus, for example, a first population of structures labeled 'A' may be interleaved with a second population of structures 'B', and the populations A and B are formed in different steps, so as to achieve a higher resolution than one step alone can produce. While the placement of the populations A and B should be identical and perfect in relation to other features on the substrate, of course every real pattern exhibits a certain positional offset. When these structures are above or below structures in a different layer, any unintentional positional offset between the layers is referred to as overlay. and needs to be measured. (The present disclosure does not concern detection of overlay shifts between the populations A and B, but between a layer with double patterning and another layer above or below it.)

FIG. 7 shows in steps (a) to (e) how two metrology targets 520 and 522 can be made for measuring overlay in a double-patterning process, using the basic method of FIG. 6. The bottom part (e) of the figure shows the finished targets in plan view, while the upper parts (a) to (d) show stages in the manufacture of the target in cross-section. The cross-section shows schematically substrate W, while lower and upper product layers L1 and L2 are added during the manufacturing process. It will be understood that the substrate carries functional device structures, whose quality depends on careful control of overlay. A real product will have many layers in practice. The targets 520 and 522 respectively comprise a plurality of overlay gratings 32'-35' and 32"-35". Each of these is similar in form to overlay gratings 32-35 used in the known method. As seen in the cross-section (d) of the finished target, these targets have grating features in both layers L1 and L2.

The substrate W is shown blank at FIG. 7 (a). At (b) gratings 540 have been formed in lower layer L1 by a first patterning step, which is the one defining population A of functional device features elsewhere on the substrate. These gratings will form the lower layer of overlay gratings 32'-35' in the finished metrology target 520. At (c) gratings 542 have been formed in lower layer L1 by a second patterning step, which is the one defining population B of functional device features. These gratings will form the lower layer of overlay gratings 32"-35" in the finished metrology target 522. At (d) an upper layer of gratings 550, 552 are provided, to complete both metrology targets 520 and 522. The upper and lower gratings are designed to have known positional offsets in X and/or Y directions that can be used to calculate an overlay measurement from the asymmetry measured in each individual grating. These known offsets (biases) are illustrated for the sake of example as having values +d and −d in each direction X and Y. Each target 520 and 522 therefore allows a measurement of overlay to be made in both X and Y directions. Different designs of target are possible, of course.

Figure 8:
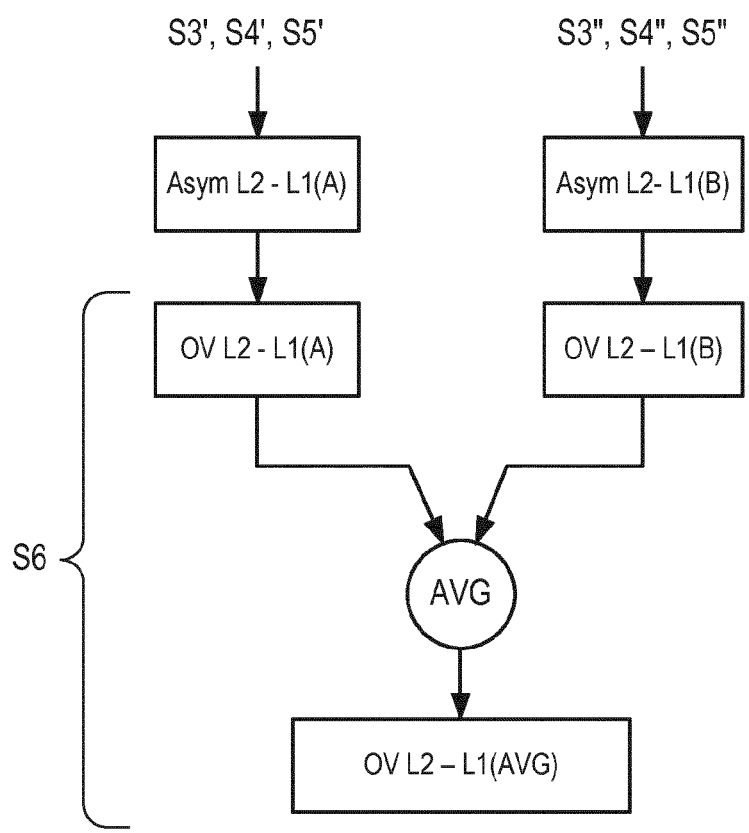
FIG. 8 is an expanded portion of the flowchart of FIG. 6, showing how measurements of the conventional metrology targets and methods are used to produce and overlay measurement relevant to the double patterning process.
Figure 9A:
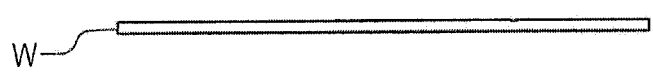
FIGS. 9(a)-9(g) show
Figure 9B:
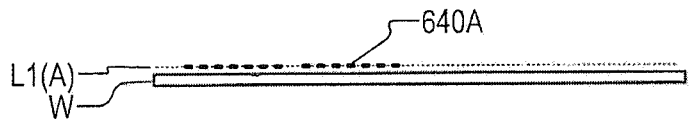
Figure 9C:
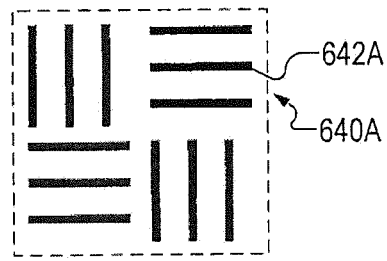
Figure 9D:
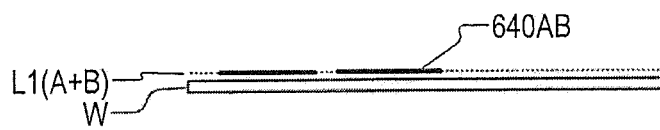
Figure 9E:
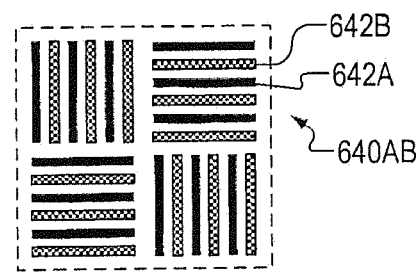
Figure 9F:
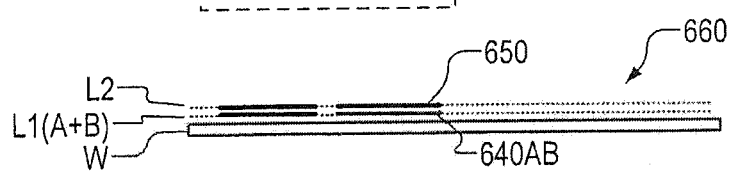
Figure 9G:
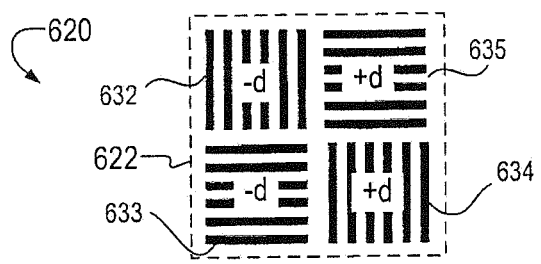

FIG. 8 shows more detail of the steps S5 and S6 that yield an overlay measurement between upper layer L2 and the double-patterned layer L1. Where the basic method of FIG. 6 has single steps S3, S4, S5, S6, each target 520 and 522 has to be measured and analyzed separately. Thus, instead of a single step S5 we illustrate calculation of asymmetry at S5' for metrology target 520 and S5" on metrology target 522. In a modified step S6, an overlay measurement OV L2−L1(A) is obtained for target 520 and another overlay measurement OV L2−L1(A) is obtained for target 522. Each of these represents a measurement of overlay between features formed in upper layer L2 and underlying features in one of the populations A and B formed in layer L1. To use the overlay measurement for practical purposes, for example to control a subsequent application of the same patterns to other substrates, an average of the A and B overlay values is calculated OV L2−L1(AVG).

While the illustrated method provides the desired average overlay measurement, it will be seen that it also requires two targets and twice the number of measurements. This is undesirable when there is a strong desire to reduce both the space ("real estate") occupied by metrology targets and the time taken for metrology during high-volume device manufacturing.

Novel Targets & Methods for Measurement of Overlay

FIG. 9 shows in steps (a) to (g) how a novel metrology target 620 can be made for measuring overlay in a double-patterning process, using the basic method of FIG. 6. The parts (a), (b), (d) and (f) show stages in the manufacture of the target in cross-section while parts (c), (e) and (g) show plan views. As before, the bottom parts (0 and (g) of the figure shows the finished target 620. The cross-section shows schematically substrate W, while lower and upper product layers L1 and L2 are added during the manufacturing process. It will be understood that the substrate carries functional device structures, whose quality depends on careful control of overlay. A real product will have many layers in practice. The target 620 comprises a plurality of overlay gratings 632-635. Each of these is a modified form of overlay gratings 32-35 used in the known method. As seen in the cross-section (f) of the finished target, these targets have grating features in both layers L1 and L2.

The substrate W is shown blank at FIG. 9 (a). At (b) partial gratings 640A have been formed in lower layer L1 by a first patterning step, which is the one defining population A of functional device features elsewhere on the substrate. As seen in the plan view (c), these partial gratings comprise structures 642A which are only a subset of the structures that will form the lower layer gratings of overlay gratings 632-635 in the finished metrology target 520. At (d) structures 642B have been formed in lower layer L1 by a second patterning step, which is the one defining population B of functional device features. These structures 642B are a second subset of the structures that form the lower layer gratings of overlay gratings 532-535 in the finished metrology target 620. The subsets are shaded differently in the plan view at (e) so that they can be distinguished for the purposes of this description. In the real target the goal of processing is for these subsets to be indistinguishable. The lower grating is complete and labeled 640AB.

At (0 an upper gratings 650 are provided in the upper layer L2, to complete the metrology targets 620. The upper and lower gratings are designed to have known positional offsets in X and/or Y directions that can be used to calculate an overlay measurement from the asymmetry measured in each individual grating. As in the conventional targets, known offsets (biases) are illustrated for the sake of example as having values +d and −d in each direction X and Y. The target 620 therefore allows a measurement of overlay to be made in both X and Y directions. Different designs of target are possible, of course.

Figure 10:
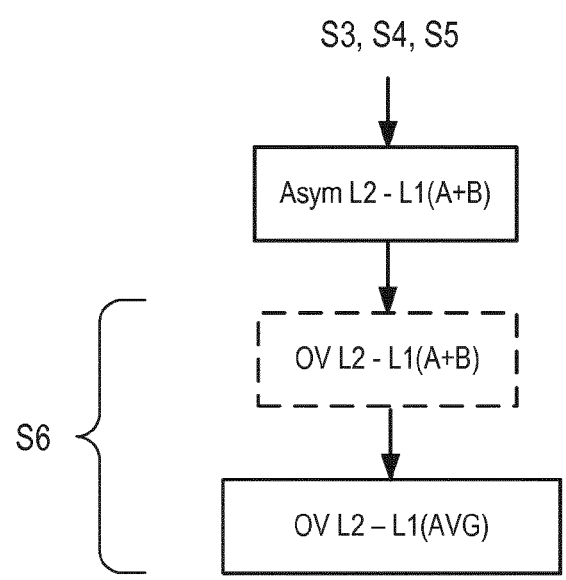
FIG. 10 is an expanded portion of the flowchart of FIG. 6, showing how measurements of the novel metrology target are used to produce an overlay measurement relevant to the double patterning process.

FIG. 10 shows more detail of the steps that directly yield an average overlay measurement between upper layer L2 and the double-patterned layer L1. Again the steps S3-S6 are labeled in reference to the basic method of FIG. 6. In contrast to FIG. 8, it will be seen that only a single target has to be processed through steps S3, S4, S5, S6. Thus, instead of measuring two targets, in a single step S5 we measure asymmetry for metrology target 620. In a modified step S6, a single overlay measurement OV L2−L1(A+B) is obtained. This value inherently represents an average of the A and B overlay values OV L2−L1(AVG). It can be used directly as the overlay measurement for practical purposes, for example to control a subsequent application of the same patterns to other substrates.

Thus the novel target saves measurement time. Notice also that space 660 is freed for use by functional features or additional metrology targets.

CONCLUSION

The techniques disclosed herein enable the design and use of small or large metrology targets to achieve economical overlay measurements even in multiple patterning processes. The need for more time-consuming or expensive metrology techniques (for example SEM) is reduced. Quality control in high-volume manufacture is enabled.

Numerous variations and modifications are possible, in addition to the ones mentioned already above. In the above examples, the double patterning is applied in the lower layer and not the upper layer. In principle, the multiple patterning can be applied in either or both layers. The skilled reader can readily apply the principles disclosed herein to measure overly in such cases.

The skilled person can also extend the principles of the present disclosure to multiple patterning processes other than double patterning. Where there are more than two patterning steps, it is a matter of design choice whether to include subsets of structures formed by every patterning step in the same target, or to provide more than one metrology target, each metrology target including a subset of the possible subsets. The method in the latter case would be a combination of the methods of FIGS. 7 and 9.

In the examples of FIG. 9, the X and Y gratings with each bias value are side-by-side, though that is not essential. The X- and Y-direction gratings are interspersed with one another in an alternating pattern, so that different X gratings are diagonally spaced, not side-by-side with one another, and Y gratings are diagonally spaced, not side-by-side with one another. This arrangement may help to reduce cross-talk between diffraction signals of the different biased gratings. The whole arrangement thus allows a compact target design, with good performance. In the examples described above, all the gratings are square, and arranged in a square grid. In another embodiment these gratings may be placed slightly off the square grid, or may be rectangular in shape in order to break the symmetry of the target. This may improve the accuracy & robustness of the pattern recognition algorithm that is used to find the targets in the images even further. Composite grating structures with elongate gratings are described for example in published patent application US20120044470, mentioned above.

While the target structures described above are metrology targets specifically designed and formed for the purposes of measurement, in other embodiments, properties may be measured on targets which are functional parts of devices formed on the substrate. Many devices have regular, grating-like structures. The terms 'target grating' and 'target structure' as used herein do not require that the structure has been provided specifically for the measurement being performed. The term "structure" is used herein without limitation to any particular form of structure such as a simple grating line. Indeed, coarse structural features, such as the lines and spaces of a grating, can be formed by collections of finer sub-structures.

In association with the physical grating structures of the targets as realized on substrates and patterning devices, an embodiment may include a computer program containing one or more sequences of machine-readable instructions describing a methods of producing targets on a substrate, measuring targets on a substrate and/or analyzing measurements to obtain information about a lithographic process. This computer program may be executed for example within unit PU in the apparatus of FIG. 3 and/or the control unit LACU of FIG. 2. There may also be provided a data storage medium (e.g., semiconductor memory, magnetic or optical disk) having such a computer program stored therein. Where an existing metrology apparatus, for example of the type shown in FIG. 3, is already in production and/or in use, the invention can be implemented by the provision of updated computer program products for causing a processor to perform the modified steps S4-S6 and so calculate overlay error to be corrected. The program may optionally be arranged to control the optical system, substrate support and the like to perform automatically the steps S2-S5, etc. for measurement of asymmetry on a suitable plurality of target structures.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method of measuring a performance parameter of a lithographic process, the method comprising:
    performing said lithographic process to form at least one metrology target having overlying structures formed in upper and lower layers on a substrate;
    taking one or more measurements of asymmetry in said metrology target using an inspection apparatus; and
    calculating, using the results of said asymmetry measurements, a measurement of the performance parameter of the lithographic process,
    wherein the lithographic process is of a multiple-patterning type whereby first and second distinct populations of structures are formed in a single one of said layers by respective first and second patterning steps,
    wherein for each of the one or more measurements said metrology target comprises a set of structures of which different subsets are formed in said first and second patterning steps.

2. The method as claimed in claim 1, wherein said performance parameter is overlay between the upper and lower layers, the calculating provides a combined performance parameter for both of the first and second patterning steps.

3. The method as claimed in claim 2, wherein overlay is calculated from measurements of asymmetry in at least two overlay gratings which have different known components of positional offset between overlying structures in the upper and lower layers, each overlay grating having structures in said single layer formed in said first and second patterning steps.

4. The method as claimed in claim 1, wherein the structures formed in said first and second patterning steps define structures in the lower layer.

5. The method as claimed in claim 1, further comprising using the calculated combined performance parameter to apply positioning corrections when the lithographic process is applied to further substrates.

6. The method as claimed in claim 5, wherein the combined performance parameter is overlay and is used to position product features in an upper layer on said further substrates accurately over features in a lower layer on said further substrates.

7. The method as claimed in claim 1, wherein the taking one or more measurements is performed by dark field imaging of overfilled targets in a scatterometer.

8. A substrate comprising:
at least one metrology target having overlying structures formed in upper and lower layers on said substrate,
wherein the overlying structures comprise first and second distinct populations of structures in each of the upper and lower layers formed in at least two patterning steps of a multiple-patterning process, each of the first and second distinct populations of structures having different subsets of structures.

9. The substrate as claimed in claim 8, wherein:
the metrology target is a composite target comprising a plurality of overlay gratings formed in upper and lower layers,
each overlay grating is formed with a positional offset between the layers that is a combination of both known and unknown components, the known components being different for different component gratings.

10. The substrate as claimed in claim 9, wherein in each of said overlay gratings, a lower layer grating comprises subsets of structures formed by at least two patterning steps of said multiple-patterning process.

11. A set of patterning devices for use in a lithographic process,
the patterning devices defining patterns that when applied to a substrate will produce a substrate having one or more metrology targets comprising:
at least one metrology target having overlying structures formed in upper and lower layers on said substrate,
wherein the overlying structures comprise first and second distinct populations of structures in each of the upper and lower layers formed in at least two patterning steps of a multiple-patterning process, each of the first and second distinct populations of structures having different subsets of structures.

12. A lithographic system comprising:
one or more lithographic apparatuses arranged to transfer a sequence of patterns from patterning devices onto a substrate in an overlying manner so as to produce one or more metrology targets on the substrate, the one or more metrology targets having overlying structures formed in upper and lower layers on the substrate;
an inspection apparatus arranged to take one or more measurements of asymmetry in said one or more metrology targets;
a processor configured to calculate a combined performance parameter for said one or more metrology targets;
wherein for each of the one or more measurements said one or more metrology targets comprise first and second distinct populations of structures that are formed in a single one of said layers by respective first and second patterning steps of a multiple-patterning type lithographic process and a set of structures of which different subsets are formed in said first and second patterning steps; and
a controller configured to use the calculated performance parameter to control a lithographic apparatus in applying at least one of said patterns to further substrates.

13. A method of manufacturing devices wherein a sequence of device patterns is applied to a series of substrates using a lithographic process, the method comprising:
inspecting a plurality of metrology targets as part of or beside said device patterns on at least one of said substrates comprising,
taking one or more measurements of asymmetry in said metrology target using an inspection apparatus; and
calculating, using the results of said asymmetry measurements, a measurement of the performance parameter of the lithographic process,
wherein the lithographic process is of a multiple-patterning type whereby first and second distinct populations of structures are formed in a single one of said layers by respective first and second patterning steps,
wherein for each of the one or more measurements said metrology target comprises a set of structures of which different subsets are formed in said first and second patterning steps, and
controlling the lithographic process for later substrates in accordance with the calculated performance parameter.

* * * * *

UNITED STATES PATENT AND TRADEMARK OFFICE
CERTIFICATE OF CORRECTION

PATENT NO. : 9,958,790 B2
APPLICATION NO. : 15/105349
DATED : May 1, 2018
INVENTOR(S) : Nooitgedagt et al.

Page 1 of 1

It is certified that error appears in the above-identified patent and that said Letters Patent is hereby corrected as shown below:

In the Specification

In Column 4, Line 53, please replace "FIGS. 9(a)-9(g) show FIG. 9 shows steps" with
--FIGS. 9(a)-9(g) show steps--.

Signed and Sealed this
Twenty-eighth Day of May, 2019

Andrei Iancu
*Director of the United States Patent and Trademark Office*